United States Patent [19]
Carpenter

[11] 3,931,586
[45] Jan. 6, 1976

[54] SCANNING OSCILLATOR STABILIZATION

[75] Inventor: Ralph A. Carpenter, Temple Hills, Md.

[73] Assignee: The United States of America as represented by the Secretary of the Navy, Washington, D.C.

[22] Filed: Mar. 21, 1975

[21] Appl. No.: 560,747

[52] U.S. Cl.................. 331/1 R; 331/1 A; 331/19; 331/25; 331/30; 331/178
[51] Int. Cl.².................... H03B 3/04; H03B 23/00
[58] Field of Search .......... 331/1 R, 1 A, 4, 19, 25, 331/30, 178; 328/185

[56] References Cited
UNITED STATES PATENTS

| | | |
|---|---|---|
| 3,221,266 | 11/1965 | Vitkovits, Jr. .................. 331/4 X |
| 3,621,450 | 11/1971 | Blair et al. .................. 331/178 X |
| 3,872,406 | 3/1975 | Grafinger .................. 331/178 |

*Primary Examiner*—Siegfried H. Grimm
*Attorney, Agent, or Firm*—R. S. Sciascia; A. L. Branning; N. V. Brown

[57] ABSTRACT

Linear accuracy of the output-signal frequency of a scanning oscillator is maintained through monitoring the location in a shift register of a pulse whose position is indicative of the frequency error from a desired scanning oscillator output-signal frequency.

4 Claims, 8 Drawing Figures

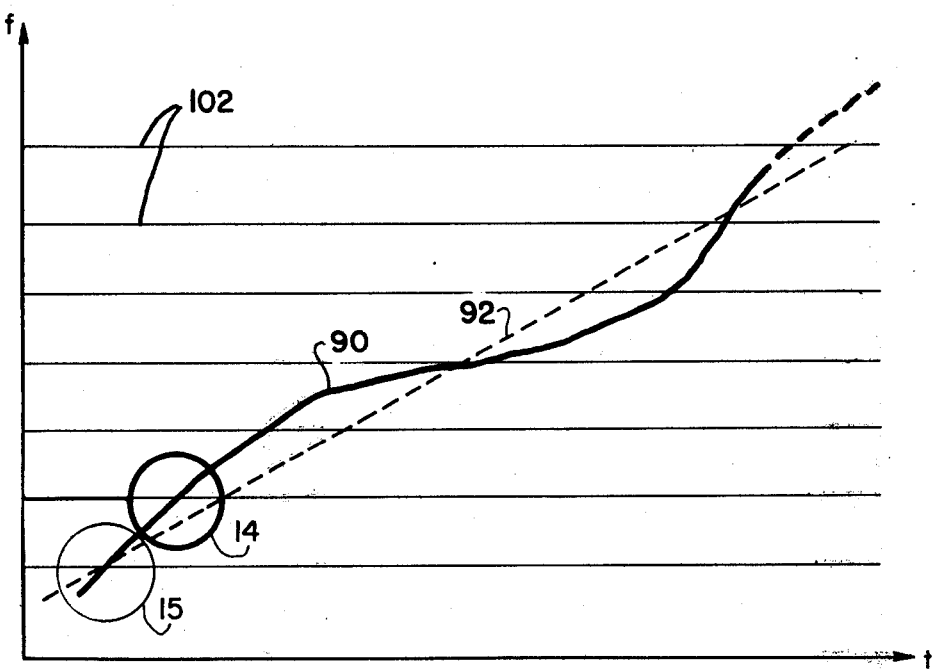
FIG. 2
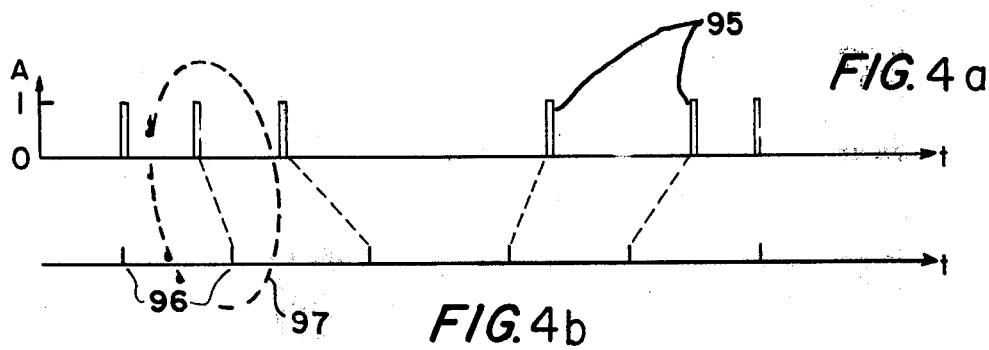
FIG. 4a
FIG. 4b

SCANNING OSCILLATOR STABILIZATION

BACKGROUND OF THE INVENTION

The present invention relates to scanning-oscillators, and more particularly to scanning-oscillator control-systems.

Scanning-oscillator devices have diverse application in fields including communications and signal processing, and find particular utility in compressive-receivers and pulse-compression radar systems.

A scanning-oscillator device is a frequency generator whose output-signal frequency is continuously varied over a particular frequency range as a function of time, as controlled by a scanning-oscillator controller. It is often important to have the output-signal frequency change at a constant, or linear, rate. Implementation of this linear sweep rate has been the subject of various prior designs. The prior attempts demonstrate that indeed it previously has been both difficult and costly to produce a scanning-oscillator having a highly accurate output-signal frequency characteristic and having an output-signal frequency variable in a highly linear fashion. Another major problem related to control of a scanning oscillator is one of not knowing how accurately the oscillator is performing while operating.

The present invention overcomes the prior disadvantages. An embodiment of the present invention accurately determines the amount of deviation of the output-signal frequency from the desired frequency, as well as providing an error-magnitude signal to the oscillator-controller indicating to what extent to alter or adjust the sweep rate.

It is therefore an object of the present invention to control a scanning frequency oscillator so as to minimize the difference between the scanning-oscillator output signal-frequency and a desired output signal-frequency.

It is a still further object of the present invention to control a frequency scanning-oscillator by comparing the time the oscillator output frequency reaches a particular reference-frequency with the desired time that the oscillator signal would be at the particular reference-frequency.

DESCRIPTION OF THE DRAWINGS

FIG. 2 illustrates typical actual and typical desired frequency-time characteristics of the output signal of a scanning frequency oscillator, and also illustrates the frequency spectrum of a series of signal lines generated by a line spectrum generator of embodiments of the present invention.

FIGS. 4a and 4b, indicate the position in time of pulses corresponding to frequency intersections depicted in FIG. 2.

DETAILED DESCRIPTION OF THE INVENTION

Figure 1:
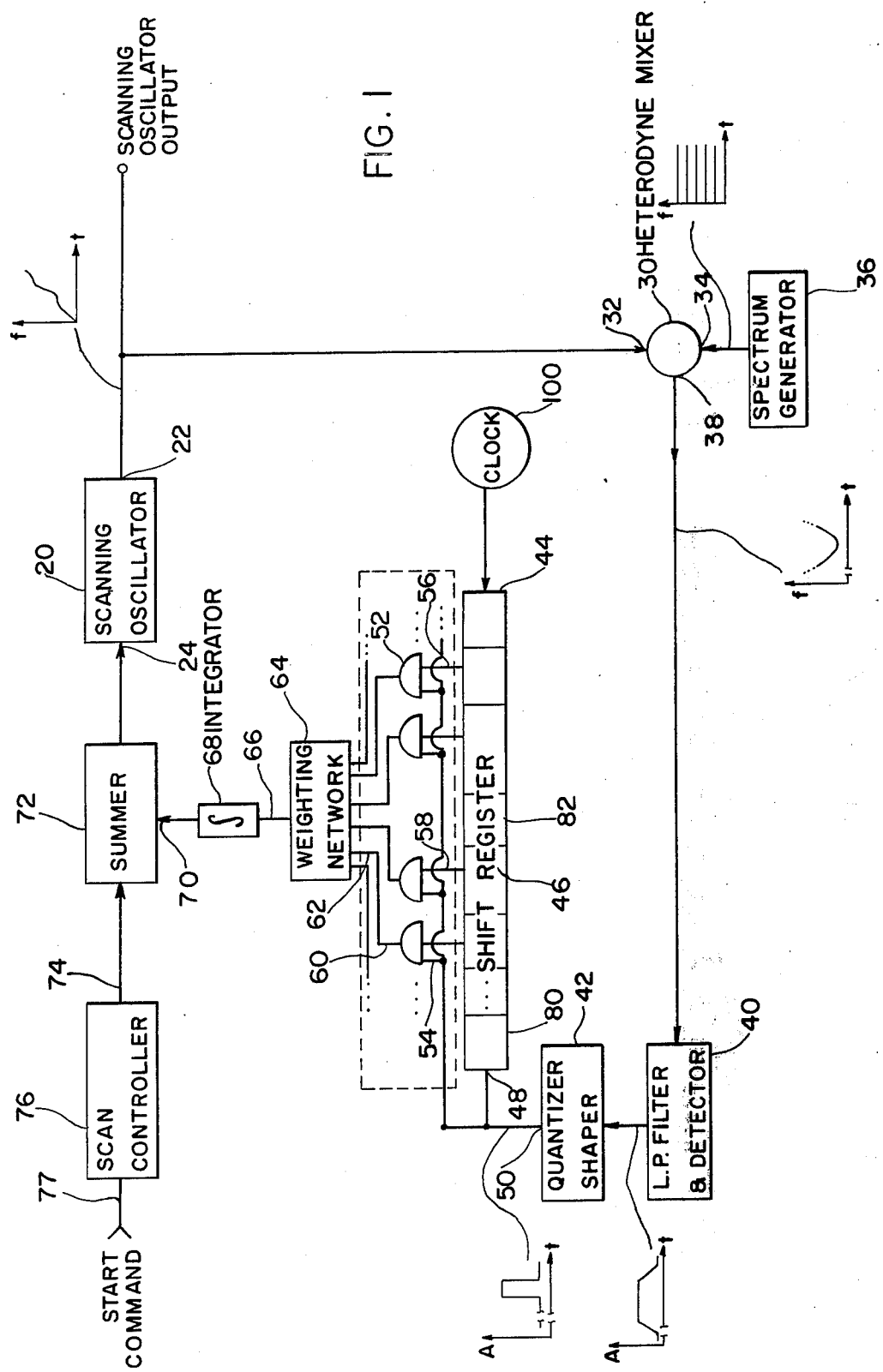
FIG. 1 is a functional block diagram showing an embodiment of the present invention.

Referring now to FIG. 1, a scanning oscillator 20 has an output terminal 22 and a control terminal 24. A heterodyne mixer device 30 has a first input terminal 32 coupled to scanning-oscillator output terminal 22 and a second input terminal 34 connected to the output of a conventional spectrum (line frequency) generator 36. The output terminal 38 of heterodyne mixer 30 is connected to the input terminal of a combined low-pass filter-detector device 40. A quantizer-shaper device 42 has its input terminal connected to the output terminal of filter-detector 40. A shift register 44, comprised of a number n stages 46 has an input terminal 48 connected to a quantizer-shaper output terminal 50. A clock 100 is connected to a clock input terminal of shift register 44. A number M of coincidence circuits 52, (e.g., AND-gates) each have a first input terminal 54 connected to quantizer output terminal 50 and a second input terminal 56 connected to a register-stage tap lead 58 of a shift register stage 46. Each coincidence circuit 52 has an output terminal 60 connected to an input terminal 62 of a signal-weighting device 64. An output terminal 66 of weighting device 64 is connected to an input terminal of an integrator device 68, whose output terminal is connected to a first input terminal 70 of a summing device 72.

Summing device 72 has a second input terminal connected to the output terminal 74 of a conventional scan controller 76, which has a start command input terminal 77. An output terminal of summing device 72 is connected to the scanning-oscillator control terminal 24.

Referring now to FIGS. 1 and 2, scanning-oscillator 20 produces an output-signal 90 at its output terminal 22 whose frequency, w, increases in a generally linear fashion with time t. It is desired that the change in frequency w be linear with time, as indicated by the dashed line 92.

The frequency w of oscillator output-signal 90 is determined by a command or control signal applied at control input terminal 24, which signal is generated by controller 76 modified by summing device 72, as later described.

In order to form "correction crossing regions" (e.g., typical regions 14, 15), a series of frequency reference lines 102, depicted in FIG. 2, is generated by spectrum generator 36. These frequency lines 102 are generated in a conventional manner over the scanning-oscillator frequency-range $R = w_f - w_s$ at intervals spaced in frequency. The frequency spacing between these reference lines 102 is determined by the frequency range R to be monitored, and by the number of correction crossing regions desired within range R. The frequency-reference lines 102 are combined with oscillator output-signal 90 in heterodyne-mixer device 30. Mixer 30 produces output signal components equal to the difference and to the sum of its input signals.

Figure 3A:
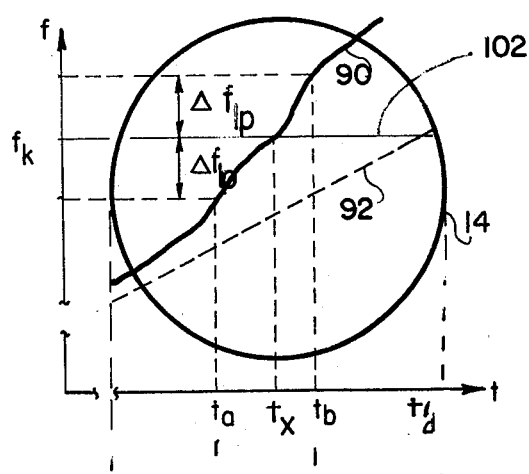
FIGS. 3a, 3b, 3c, and 3d illustrate signal components present at various points in the embodiment of the present invention described below.
Figure 3B:
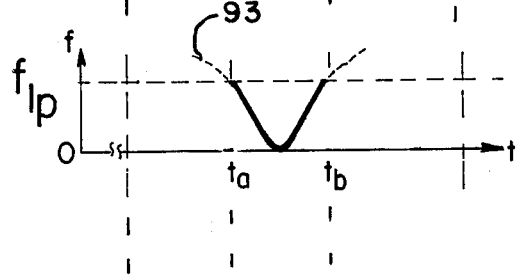

Turning now to FIG. 3, a typical crossing region 14 is depicted in greater detail in FIG. 3a. The desired output-signal 92 would reach a typical frequency-reference line 102 of frequency $f_k$ at a time $t_d$, but the actual oscillator signal 90 (in need of correction) reaches the frequency $f_k$ at a time $t_x$. The output signal from mixer 30 is depicted by line 93 (in FIG. 3b) during the time immediately before and after oscillator signal 90 crosses frequency $f_k$.

Figure 3C:
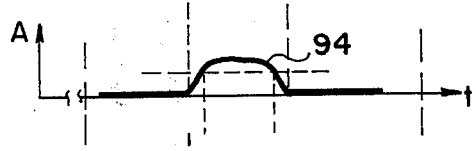
Figure 3D:
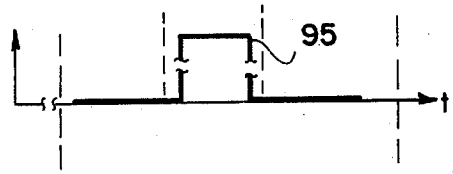

Filter-detector 40 has an output signal which is essentially zero for input-signal frequencies greater than frequency $f_{lp}$, and which is essentially a constant for input-signal frequencies less than $f_{lp}$. Thus, low-pass filter-detector 40 detects and indicates only difference frequencies, $f_\Delta$, between frequency-reference lines 102 and oscillator output-signal 90 which are below a frequency $f_{lp}$. It can readily be seen from FIG. 3a and 3b that as oscillator output signal 90 crosses frequency line $f_{lp}$, the difference frequency, $f_\Delta$, goes from greater than $f_{lp}$, through zero, and then increases to a frequency greater than $f_{lp}$. The filter-detector output-signal 94 corresponding to the hetero-dyne mixer output-signal 93 is depicted in FIG. 3c.

Quantizer-shaper 42 generates a narrow output reference-pulse 95 (FIG. 3d) upon each change from zero to constant amplitude of detector output signal 94.

In this manner a reference-pulse 95 is produced whenever the frequency of scanning oscillator output-signal 90 crosses a reference-frequency line 102.

It should be noted that a frequency discriminator circuit or other equivalent circuit may also be utilized to perform the function of detector 40-quantizer 42, i.e., for detecting the moment in time that the frequency of scanning-oscillator signal 90 crosses a frequency reference line 102.

FIG. 4a shows a series of time spaced reference-pulses 95 corresponding to crossings of the scanning-oscillator output-signal 90 with reference frequency lines 102 (i.e., time points $t_x$). For purposes of discussion, the desired time of crossing of reference frequency lines 102 scanning-oscillator output-signal 90 (i.e., time points $t_d$) is illustrated by time-check lines 96 shown in FIG. 4b. Time-check lines 96 indicate where in time corresponding reference-pulses 95 would occur if the scanning-oscillator output-signal 90 followed the desired signal characteristic 92 (as indicated in FIGS. 2 and 3a).

Each reference-pulse 95 is applied to the shift-register input-terminal 48, and to the first input-terminal 54 of each coincidence circuit (AND-gate) 52.

Clock 100 causes a pulse stored in one shift-register stage to be shifted to the next adjacent atage. The time taken for a pulse stored in the first shift-register stage 80 to progress to a central, or uncompensated, register stage 82, is termed the pulse transit-period. The uncompensated stage is a stage not connected to any of the coincidence circuits 52. The period between adjacent output pulses 95 is termed the check-period. The period of time between time-check lines 96 (i.e., the period between each successive $t_d$ occurrence) is termed the desired occurrence period. The clock rate is adjusted so as to cause the pulse transit-period to be equal to the desired occurrence period. Then the clock is adjusted in this manner, a reference pulse 95 occurring at the beginning of the scanning-oscillator sweep cycle and present at first shift-register stage 80 will be shifted so as to be located at uncompensated stage 82 when the next reference-pulse 95 arrives at first shift register stage 80, as long as scanning-oscillator output-signal 90 is following exactly the desired linear characteristic 92. If the ouput signal 90 deviates from the desired linear characteristic 92, the time $t_x$ at crossing will be different from the desired crossing time $t_d$, and the output pulse 95 corresponding to the crossing $t_x$ will, at the end of the pulse-transit period, not be located at uncompensated stage 82 but at a state to either side of it. For example, the output 90 in region 14 is seen to cross frequency $f_k$ reference line 102 at time $t_x$, before the desired time $t_d$. Thus the corresponding output pulse 95 (for a typical crossing region 14) will occur prematurely, as depicted in the dotted-encircled pair 97 of FIG. 4. Each coincidence device 52 will produce an output signal, termed a pulse-position indication signal, if it simultaneously receives a reference pulse 95 at its first input terminal 54 and senses a prior reference pulse 95 present in its corresponding register stage (sensed through corresponding tap 58).

The pulse-position signal is weighted by weighting network 64, which generates an error signal whose magnitude (and sign) is related to the position in the shift-register of a reference pulse 95 when a subsequent reference pulse 95 arrives at first register stage 80. The further away a particular register-stage is from the uncompensated stage 82, the greater weighting is made of the corresponding pulse-position indication signal. The pulse-position indication signal is weighted with a "+" (plus) if its corresponding stage is to the right of uncompensated stage 82, and with a "−" if its corresponding stage is to the left. Thus, the weighted pulse indication signal indicates the magnitude and sense of the error present in scanning oscillator output signal 90, (i.e., deviation from desired linear behavior characteristic 92).

Integrator 68 then integrates the weighted pulse position error signal over time to produce an integrated error signal. The integrated error signal is summed by summing device 72 with the output signal from scan-controller 76, producing an adjusted scanning-oscillator control-signal. The adjusted control-signal directs scanning-oscillator 20 to modify its rate of change, causing it to be more in conformance with the desired output signal 92.

The error detection circuit may also be implemented by analogue means by use of conventional phase discriminator circuitry wherein the time of occurrence of a pulse generated by the scanning socillator's crossing a frequency-reference line 102 is compared with the phase of the clock oscillator. The integrated output of such conventional phase discriminator is proportional to the time error with appropriate polarity to indicate the direction of error. Typical implementations of this nature are described, for example in Electronic and Radio Engineering by R. E, Terman, McGraw Hill (1955) at page 610.

Obviously many modifications and variations of the present invention are possible in light of the above teachings. It is therefore to be understood that within the scope of the appended claims the invention may be practiced otherwise than as specifically described.

What is claimed and desired to be secured by letters patent of the United States is:

1. In a control-system for a scanning-oscillator having a frequency scanning-range R, said oscillator being controlled by a signal from a scanning-oscillator controller, the improvement comprising:

means connected to the output of said scanning-oscillator for generating a crossing-signal upon the frequency of the scanning-oscillator output-signal crossing each of a set of equally spaced in frequency check-frequencies within said scan range R;

means connected to the output of said crossing-signal generating means for delaying each said crossing-signal by a time, termed the desired time, between the occurrence of said crossing-signals when said output signal is following a desired linear change in frequency;

means connected to the output of said crossing-signal generating means and to said delaying means for determining when the time difference between the occurrence of two successive ones of said crossing signals is different by at least a predetermined threshold amount from said desired time, and for generating an error signal having a magnitude proportional to said difference and a sign indicative of the sense of said difference;

means, having a first input terminal connected to the output of said time difference determining error signal generating means; a second input terminal connected to the output of said scanning-oscillator controller, and an output terminal coupled to the control input of said scanning oscillator for combining said error signal and the signal from said controller;

whereby said signal form said controller is modified by combination with error signal.

2. The scanning oscillator control system of claim 1 wherein said delaying means comprising a shift register and a clock means connected thereto, and wherein the clock rate is adjusted so as to shift a value present in the first stage of said shift register to an uncompensated stage in a time equal to said desired time.

3. The scanning oscillator control system of claim 2 wherein said time difference determining means comprises a plurality of coincidence detection circuits each having one input terminal connected to the output terminal of said crossing-signal generating means, and each having a second input terminal connected to a corresponding stage of said shift register.

4. The scanning oscillator control system of claim 3 wherein said crossing signal generating means comprises:

means for generating a series of equally spaced in frequency lines over the scanning range R;

means, having a first input terminal connected to the output of said scanning oscillator and a second input terminal connected to the output of said frequency line generating means, for generating a signal having a frequency equal to the difference between the frequencies of the signals applied at its first and second input terminal; and, means connected to the output terminal of said difference frequency generating means for producing a pulse whenever said difference frequency passes through zero;

whereby said coincidence-means determines the position of said pulse in said shift register as an indication of the deviation of the scanning oscillator output signal from a desired linear characteristic.

* * * * *